United States Patent
Oh et al.

(10) Patent No.: US 6,942,497 B2
(45) Date of Patent: Sep. 13, 2005

(54) SOCKET ASSEMBLY FOR TEST OF INTEGRATED CIRCUIT, AND ITS INTEGRATED CIRCUIT AND TESTER

(75) Inventors: Jung-Hoon Oh, Seoul (KR); Jeong-yang Kim, Chunan (KR); Young-Soon Lim, Kyounggi-do (KR); Byung-Wook Park, Yongia (KR); Jung-Mu Lee, Yongia (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/748,931

(22) Filed: Dec. 30, 2003

(65) Prior Publication Data

US 2004/0152347 A1 Aug. 5, 2004

(30) Foreign Application Priority Data

Jan. 17, 2003 (KR) .............................. 10-2003-0003261

(51) Int. Cl.[7] .............................................. H01R 12/00
(52) U.S. Cl. ......................................................... 439/73
(58) Field of Search ........................ 439/73, 152, 330, 439/525, 591, 296, 72

(56) References Cited

U.S. PATENT DOCUMENTS

| | | | | |
|---|---|---|---|---|
| 3,573,617 A | * | 4/1971 | Randolph et al. ........... 324/755 |
| 4,437,718 A | * | 3/1984 | Selinko ....................... 439/591 |
| 4,564,251 A | * | 1/1986 | Hansen et al. ................. 439/71 |
| 4,750,890 A | * | 6/1988 | Dube et al. .................. 439/152 |
| 4,768,972 A | * | 9/1988 | Ignasiak et al. ............ 439/330 |
| 4,996,476 A | * | 2/1991 | Balyasny et al. ........... 324/754 |
| 5,444,387 A | | 8/1995 | Van Loan et al. .......... 324/754 |
| 6,086,387 A | | 7/2000 | Gallagher et al. ............. 439/71 |

* cited by examiner

*Primary Examiner*—Jean F. Duverne
(74) *Attorney, Agent, or Firm*—Mills & Onello LLP

(57) ABSTRACT

The socket assembly includes a guide block, a guide part and a pressurizing plate. The guide block is in a terminal region of a test board, the guide block defining an area into which an integrated circuit can be inserted opposite terminals formed on the test board in the terminal region. The guide part is provided on an inner side wall of the guide block, to guide an insertion position of the integrated circuit so that respective leads of the integrated circuit are aligned with the corresponding terminals of the test board. The pressurizing plate is adapted to interface with the guide block, the pressurizing plate including a pressurizing protrusion on a surface thereof, such that when the pressurizing plate is applied to the guide block, the respective leads of the integrated circuit are urged to connect with the corresponding terminals of the test board.

21 Claims, 4 Drawing Sheets

SOCKET ASSEMBLY FOR TEST OF INTEGRATED CIRCUIT, AND ITS INTEGRATED CIRCUIT AND TESTER

BACKGROUND OF THE INVENTION

1. Field of the Invention

The present invention relates to test equipment for an integrated circuit; and more particularly, to a socket assembly for an integrated circuit test, and an integrated circuit and a tester using such a socket assembly.

2. Description of the Related Art

In SOC(System On a Chip) products, it is generally required that normal electrical characteristics are exhibited under high voltage stress(HVS), under high and low temperature, and under extremely-low temperature environment etc. Such quality assurance is guaranteed through a variety of testing procedures from the time the circuit is in a wafer state before packaging through the time it is in a completed chip state following packaging. In particular, though it is often times desirable that a completed chip is die-attached onto to a test circuit board for electronic products, during the testing of circuit characteristics and during quality assurance, there are many problems related to timing elements and efficiency owing to such procedures as aligning, connecting, and again separating the test circuit board and integrated circuits. Thus, it is generally acceptable to perform the test for the characteristics by temporarily connecting the integrated circuit to a test board, rather than the circuit board.

A socket assembly is adapted to stably connect the integrated circuit to the test board. A conventional approach for electrical connection of the integrated circuit to the test board using a socket assembly will now be described referring to the accompanied drawings, as follows.

Referring first to FIG. 1, provided is a test board B on which a plurality of terminals T are equipped respectively corresponding to leads (probe pins) L of the integrated circuit (hereinafter, referred to as a 'chip') IC, and on which circuit patterns P for connecting the respective terminals T with other electronic components (not shown) are equipped. The chip IC is installed thereon from an upper part of the test board B, and each of the leads L of the chip IC is electrically connected to each of corresponding terminals T.

As shown in FIGS. 1 and 2, the socket assembly includes a main body 10 combined with the test board B through a general method, the main body 10 having an insertion hole 12 for exposing a portion where individual terminals T of the test board B are formed; a needle block 20, which is combined through an insertion into the insertion hole 12 and has an installment portion of the chip IC equipped from an upper part thereof; and a pressurizing plate 30 configured to cover an upper part of the main body 10 including the needle block 20, to apply downward pressure on a chip IC placed in the needle block 20. In the construction of the socket assembly, and in the relationship between the main body 10 and the needle block 20, each of short jaws 14 is formed in a lower side of each corner portion in an inner wall of the insertion hole 12, and the needle block 20 correspondingly inserted into the insertion hole 12 is matching combined with an inner side of the insertion hole 12 including the short jaws 14, thus the short jaw 14 and its corresponding portion are close fixed to each other by using a general fastening instrument (not shown) such as bolt etc. In configuring the main body 10 and the pressurizing plate 30, a holder 18 is hinge-connected to each of both portions of the main body 10, and has a hook 16 which is provided in an inner side portion of the main body 10 by a rotation of the holder 18 to secure the pressurizing plate in place, as shown. Further, in an upper sidewall of the pressurizing plate 30 corresponding to the holder 18, a stop flute 32 matched with the hook 16 is formed, and the hook 16 is supported by the stop flute 32 under rotation of the holder 18.

In the configuration of the needle block 20, resilient vertical piercing needles 22 are each electrically connected respectively to terminals T provided on the test board B. Upper ends of the needles 22 each project elastically from a bottom of a position flute 24 that is formed in an upper center portion of the needle block 20. The position flute 24 is provided with a guide frame 26 for guiding the chip IC to be positioned from an upper part thereof, and the chip IC supported by the guide frame 26 is put therein so that respective leads L equipped with the chip are individually supported by upper ends of corresponding needles 22.

In the configuration of the pressurized plate 30, provided is a pressurizing protrusion 34 that projects downward from the lower center face of the pressurizing plate 30. The pressurizing protrusion 34 applies mechanical pressure to electrically connect the respective leads L of the chip IC placed on the position flute 24 with the corresponding respective needles 22, through the combination between the main body 10 and the pressurizing plate 30, to thus provide an electrical connection relationship between the chip IC and the test board B through the individual needles 22.

In testing procedures of the chip IC based on this configuration, first the main body 10 is installed in a determined position of the test board B through a general method. The needle block 20 is inserted into and combined with the insertion hole 12 of the main body 10, to thus determine the horizontal position of the needle block 20 and its aligning position. At this time, each of the needles 22 projected downward from the needle block 20 is elastically and electrically connected with its corresponding individual terminals T. Under this state, the chip IC to be tested is put on the position flute 24 of the needle block 20 from an upper part of the needle block 20, and then the chip IC is guide-supported by the guide frame 26, and is positioned so that each of the leads L equipped with the chip IC corresponds to each of the needles 22 elastically projecting from the bottom of the position flute 24. Subsequently, in a combined procedure between the pressurizing plate 30 and the main body 10 from an upper part thereof, the pressurizing protrusion 34 of the pressurizing plate 30 applies pressure so that each lead L of the chip IC is stably connected with each corresponding needle 22. In this manner, a chip test using the test board B is performed.

In such a test, load capacity applied onto the test board B has become a restriction to a characteristic test of the chip IC, in view of the electrical drive relationship of the chip IC, based on high integration and increased input/output frequency. Further, the needles 22 for electrically connecting the respective terminals T of the test board B and its corresponding respective leads L of the chip IC increase the load capacity. Furthermore, by directly connecting the respective leads L of the chip IC with the respective terminals T of the test board B, accurate characteristic testing of the chip IC is provided, since it more closely approximates the die-attached test viewpoint of the design. In the meantime, there is difficulty in that the test board B may become damaged after continuous testing of a number of IC chips. Through the indirect connection using the needle 22, though chip performance characteristics are diminished, as compared to direct connection, indirect connection offers the advantage that verification of a large number of samples can be readily performed. Also, indirect connection using the needles (probe pins) 22 is more efficient in alignment, attachment and detachment as compared with the direct connection.

SUMMARY OF THE INVENTION

A feature of the present invention is to provide a socket assembly for an integrated circuit test, and its integrated circuit and tester, in which both direct and indirect connection of an integrated circuit with the test board can be selected so as to increase test efficiency, and in which a load capacity between respective terminals provided on the test board and respective leads of the integrated circuit is reduced through direct connection so as to increase reliability of an electrical characteristic test for the integrated circuit.

Another feature of the present invention is to provide a socket assembly for an integrated circuit test, and its integrated circuit and tester, in which through selection of the direct or indirect connection, an electrical characteristic test and load capacities of the needles can be tested diversely and compared easily on the basis of data of direct connection, concerning various needle specifications in an indirect connection, to thus select a needle specification having an appropriate structure. In this manner, direct connection testing for numerous chips can be continuously performed in a short time, as in the indirect connection relationship, so as to increase test reliability.

In one aspect, the present invention is directed to a socket assembly for an integrated circuit test. The assembly comprises a guide block provided in a terminal region of a test board, said guide block defining an area into which an integrated circuit can be inserted opposite terminals formed on the test board in the terminal region. A guide part is provided on an inner side wall of the guide block, to guide an insertion position of the integrated circuit so that respective leads of the integrated circuit are aligned with the corresponding terminals of the test board. A pressurizing plate is adapted to interface with the guide block, the pressurizing plate including a pressurizing protrusion on a surface thereof, such that when the pressurizing plate is applied to the guide block, the respective leads of the integrated circuit are urged to connect with the corresponding terminals of the test board.

The guide block may be shaped to include an insertion hole, through which the terminal region of the test board is exposed and in which the integrated circuit can be inserted. In this case, the guide part is provided on an inner wall of the insertion hole, and is configured as a vertical flute or protrusion to mate with a mating protrusion or flute on a side portion of the integrated circuit so as to guide the horizontal position of the integrated circuit during vertical insertion.

The guide block may comprise at least two independent separated sidewalls positioned in the terminal region of the test board. In this case, the guide part is configured at the sidewall of the guide block as a vertical flute or protrusion to mate with a mating protrusion or flute on a side portion of the integrated circuit so as to guide the horizontal position of the integrated circuit during vertical insertion.

The guide block may further comprise an elevating part, said elevating part being adapted to support and elastically elevate an inserted integrated circuit. The elevating part may further comprise: a vertical support flute, said support flute being formed on an inner wall of the guide block, wherein said elevating part comprises a support member inserted into the support flute to be vertically raised and lowered so that an end part of the support member projecting from the guide block supports an inserted integrated circuit; and a resilient member communicating with the support member, for elastically elevating the support member.

The pressurizing plate may further comprise an aligning part, said aligning part being formed between the pressurizing protrusion and being for mating with an alignment feature of the integrated circuit. The pressurizing plate may further comprise an elastic member for elastically pressurizing the leads of the integrated circuit through the pressurizing protrusion.

In another aspect, the present invention is directed to a socket assembly for an integrated circuit test. The socket assembly includes a main body provided on a test board to expose a terminal region, the terminal region having terminals formed thereon. A guide block is provided in the main body defining an area into which an integrated circuit can be inserted opposite the terminals of the terminal region. A guide part is provided on an inner side wall of the guide block, to guide an insertion position of the integrated circuit so that respective leads of the integrated circuit are aligned with the corresponding terminals of the test board. A first pressurizing plate is adapted to interface with at least one of the main body and an upper part of the guide block, the first pressurizing plate including a pressurizing protrusion on a surface thereof, such that when the pressurizing plate is applied to the at least one of the main body and the guide block, the respective leads of the integrated circuit are urged to connect with the corresponding terminals of the test board.

The assembly may further comprise: a needle block adapted to replace the guide block configured to cover the terminal region, said needle block supporting the integrated circuit and elastically connecting the respective leads of the integrated circuit and the corresponding terminals of the test board, the needle block including a plurality of needles, the upper and lower ends of which pierce upper and lower surfaces of the needle block to connect the integrated circuit leads and the terminals of the test board; and a second pressurizing plate adapted to replace the first pressurizing plate, the second pressurizing plate including a pressurizing protrusion on a surface thereof, such that when the second pressurizing plate is applied to the needle block, the respective leads of the integrated circuit are urged to connect with the underlying needle upper ends.

The guide block may further comprise an elevating part, said elevating part being adapted to support and elastically elevate an inserted integrated circuit.

The guide block may be shaped to include an insertion hole, through which the terminal region of the test board is exposed and in which the integrated circuit can be inserted. In this case, the guide part is provided on an inner wall of the insertion hole, and is configured as a vertical flute or protrusion to mate with a mating protrusion or flute on a side portion of the integrated circuit so as to guide the horizontal position of the integrated circuit during vertical insertion.

The guide block may comprise at least two independent separated sidewalls positioned in the terminal region of the test board. In this case, the guide part is configured at the sidewall of the guide block as a vertical flute or protrusion to mate with a mating protrusion or flute on a side portion of the integrated circuit so as to guide the horizontal position of the integrated circuit during vertical insertion.

In another aspect, the present invention is directed to an integrated circuit, in a socket assembly, which includes a guide block provided in a terminal region of a test board, the guide block defining an area into which an integrated circuit body having a plurality of leads can be inserted; a guide part provided on an inner side wall of the guide block having a vertical flute or protrusion, to guide an insertion position of the integrated circuit body so that the respective leads are each aligned with corresponding terminals of the test board. A pressurizing plate includes a pressurizing protrusion on a surface thereof, such that when pressurizing force is applied to the guide block, the respective leads of the integrated circuit are urged to connect with the corresponding terminals of the test board. The integrated circuit comprises a guide member in the shape of a vertical protrusion or flute adapted to mate with the vertical flute or protrusion of the guide block, for aligning the integrated circuit relative to the guide block.

The socket assembly may further comprise an elevating part on the guide block, said elevating part including a vertical support flute; a support member inserted into the support flute to be vertically raised and lowered so that an end part of the support member projecting from the guide block supports an inserted integrated circuit; and a resilient member communicating with the support member, for elastically elevating the support member; and further comprising a support flute formed on a surface of the integrated circuit to be supported by the end part of the support member.

The pressurizing plate may further comprise an aligning part, said aligning part being formed between the pressurizing protrusion and being for mating with an alignment feature of the integrated circuit.

In another aspect, the present invention is directed to an integrated circuit tester, in a socket assembly, which includes a guide block provided in a terminal region of a test board, the guide block defining an area into which an integrated circuit body having a plurality of leads can be inserted; a guide part provided on an inner side wall of the guide block having a vertical flute or protrusion, to guide an insertion position of the integrated circuit body so that the respective leads are each aligned with corresponding terminals of the test board; and a pressurizing plate including a pressurizing protrusion on a surface thereof, such that when pressurizing force is applied to the guide block, the respective leads of the integrated circuit are urged to connect with the corresponding terminals of the test board. The integrated circuit tester comprises: a guide member in the shape of a vertical protrusion or flute adapted to mate with the vertical flute or protrusion of the guide block, for aligning the integrated circuit relative to the guide block.

BRIEF DESCRIPTION OF THE DRAWINGS

The foregoing and other features and advantages of the invention will be apparent from the more particular description of exemplary embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

A socket assembly for an integrated circuit test, and an integrated circuit and integrated circuit tester using such an assembly, are described as follows in accordance with exemplary embodiments of the present invention.

Figure 1:
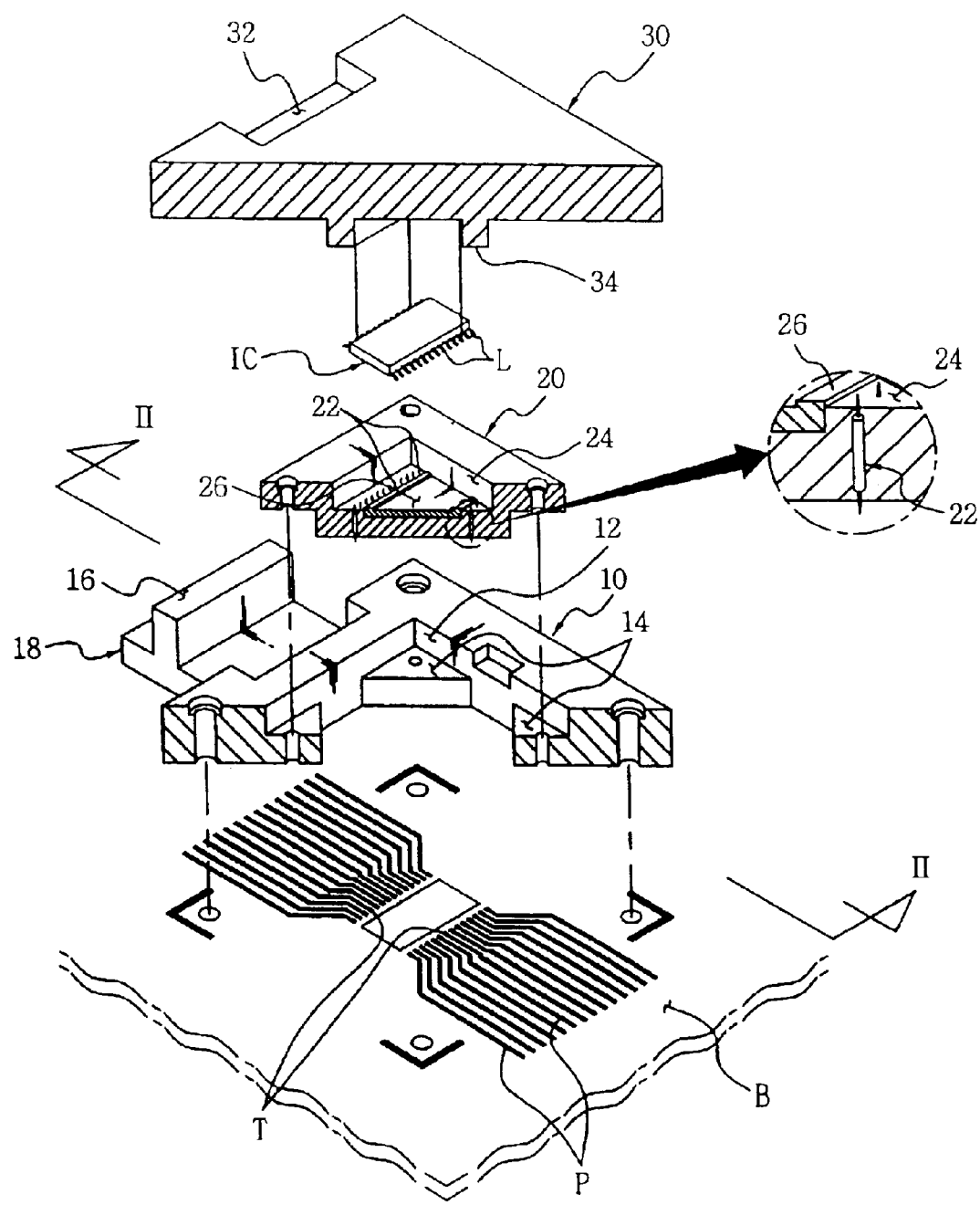
FIG. 1 is a perspective view schematically illustrating a socket assembly for an integrated circuit test according to a prior art.
Figure 2:
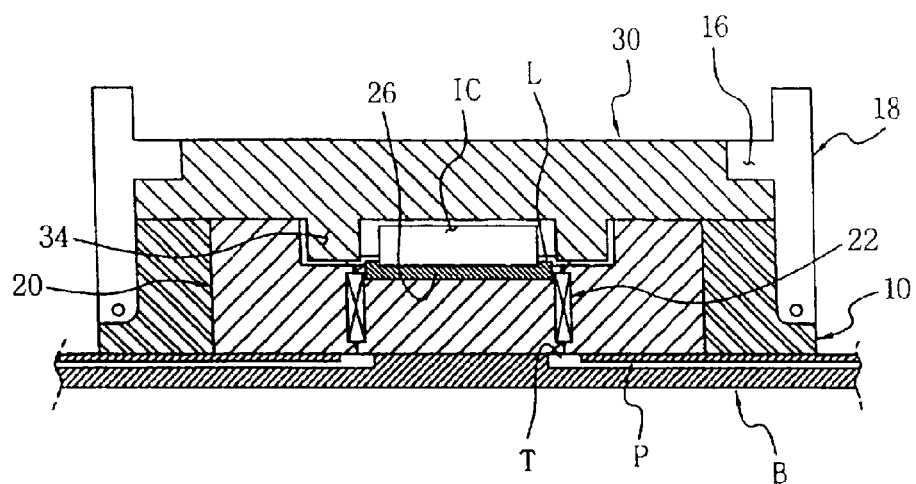
FIG. 2 is a sectional view taken along II—II line shown in FIG. 1, illustrating a schematic combination relationship between components.
Figure 3:
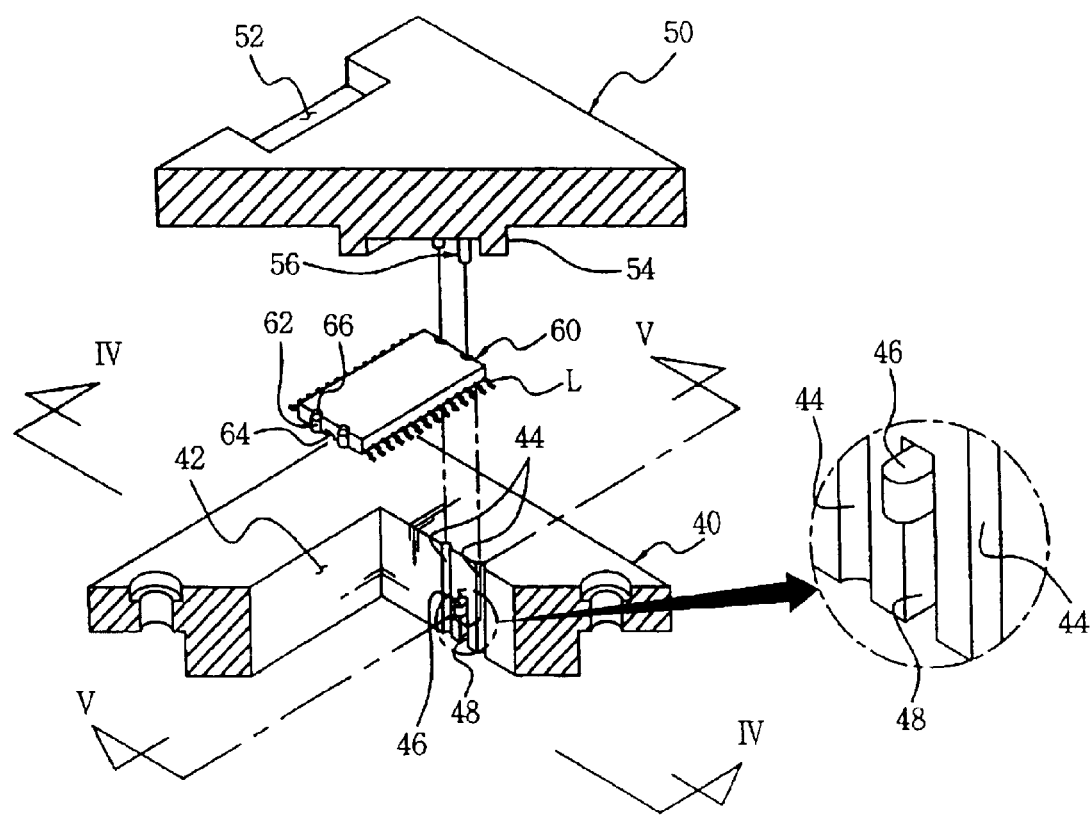
FIG. 3 is a perspective view of a socket assembly for an integrated circuit test according to an exemplary embodiment of the present invention.
Figure 4:
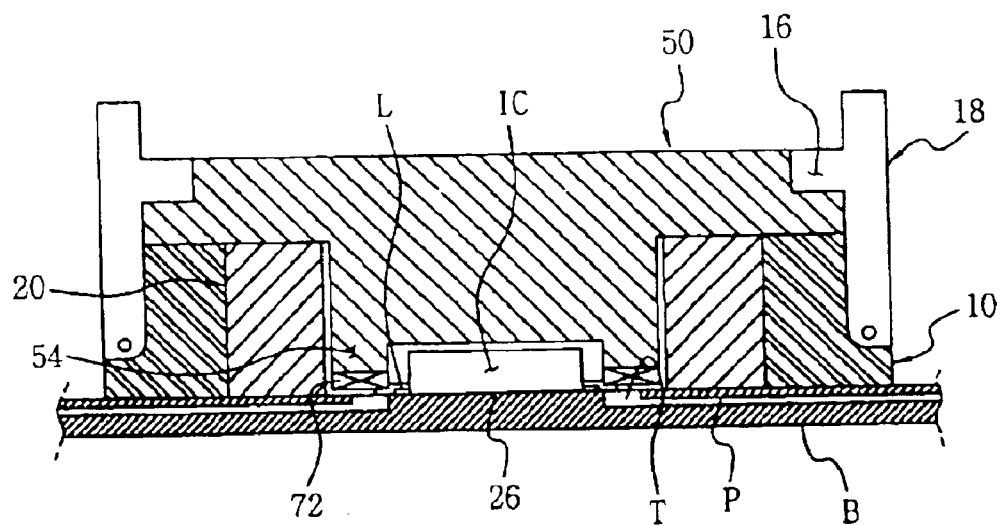
FIG. 4 is a sectional view schematically illustrating a combination relationship between components along the IV—IV line shown in FIG. 3.
Figure 5A:
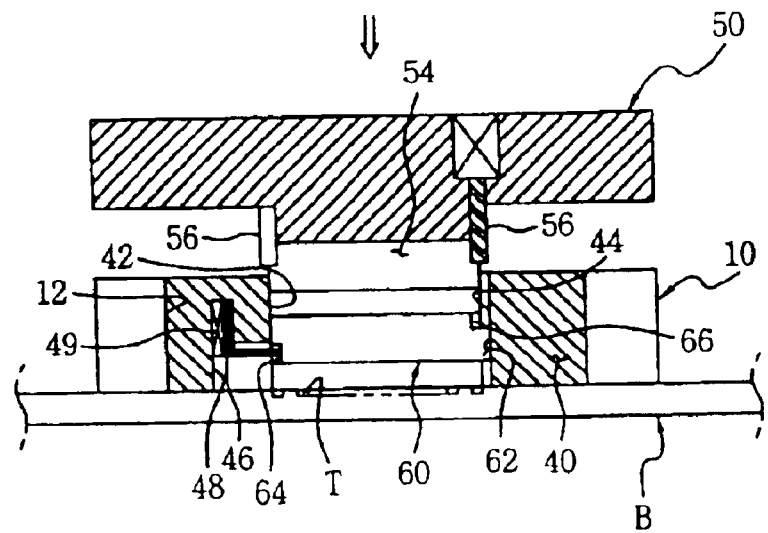
FIGS. 5a and 5b are stepped sectional views taken along V—V line shown in FIG. 3, illustrating a combination relationship between components and connection between an integrated circuit and a test board.
Figure 5B:
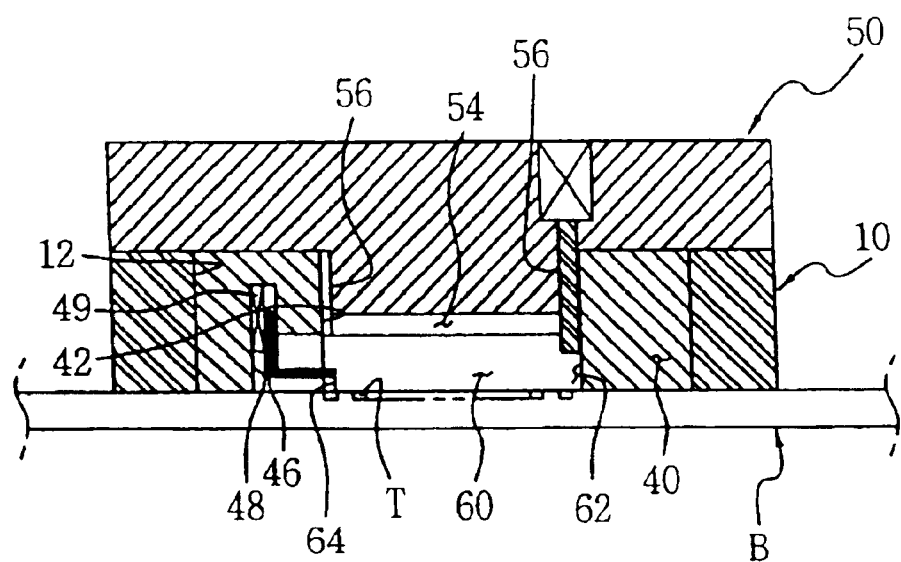

FIG. 3 is a perspective view of a socket assembly for an integrated circuit test, schematically illustrating the configuration and combination relationship among components, according to an exemplary embodiment of the present invention. FIG. 4 is a sectional view schematically illustrating a combination relationship between components along the IV—IV section line shown in FIG. 3. FIGS. 5a and 5b are stepped sectional views taken along the V—V section line shown in FIG. 3, illustrating a combination relationship between components and connection between an integrated circuit and a test board.

Referring to FIGS. 3, 4, 5a and 5b in a socket assembly for an integrated circuit test, a main body 10 is combined with a test board B, namely, in the region of respective terminals T formed on the test board B, in a manner that exposes the terminals T at an upper part thereof. The main body 10 is formed to surround the periphery of the terminal region so as to expose the terminals of the test board B. The main body 10 has an insertion hole 12 in which each of leads L of the integrated circuit IC is opposite to each of the terminals and can be inserted and removed.

Further, though not shown in the drawings hereby, the main body can be configured with at least two separate, independent sidewalls so that the terminal formed region provided on the test board B is exposed therebetween and the individual terminals T are distant from each other between both the sidewalls. This latter multiple-piece configuration of the main body offers the advantage of manufacturing ease, as compared with the process precision of the above-described unitary body configuration, from the viewpoint of an interval range relationship between the terminals T and their connection relationship with the IC, etc. Relatively, the latter configuration of the two-piece body requires assembling precision, in comparison with the former single body configuration.

For the direct connection configuration between the integrated circuit and the test board B, the main body 10 is not necessary, and, in this configuration, only the guide block 40 is assembled with the test board B. In this case, the guide block 40 can be configured in a unitary ring shape, namely with an insertion hole or guide hole 42 through which the terminal region is exposed from above, as in the configuration of the main body 10, or can be configured as at least two separate members mounted about the terminal region.

The guide block 40 is provided with a guide part 44 that is formed on an inner side face of the guide block 40, namely on a sidewall in the region where the terminals T of the test board B are not positioned, The guide part 44 provides a vertical guide reference for positioning of the inserted integrated circuit IC in order to ensure that, once fully inserted, each lead L of the IC is directly coupled with each of the terminals T. The guide part 44 can be configured, for example, with a vertical flute (or groove) or protrusion so as to support a side portion of the IC and to maintain the horizontal position of the IC and to simultaneously guide vertical ascent and descent positioning of the IC. The flute or protrusion is formed in the insertion hole 42 based on a shape of the guide block 40 or in a sidewall of the guide block 40 approximately corresponding to the terminal formed region. This guide part 44 can be formed, for example, in a flute shape into which a mating protrusion of the IC can be inserted, or vice versa. In this configuration, in one embodiment, and as shown in FIG. 3, in the guide part, a vertical flute or protrusion is formed to correspond with a like protrusion or flute on a non-lead side of the IC. A similar mating a protrusion or flute is formed on the IC, in order to allow for a vertical sliding relationship between the IC body and the guide part 44. Other guide relationships are possible and equally applicable to the principles of the present invention. For example, a variation from the protrusion or flute of the IC can be provided as such a shape that each corner portion of the IC has a vertical chamfer shape, or has a vertical protrusion shape or has a stepped shape formed along a girth of sidewall thereof, and the guide part can be formed as a shape conformable to the side part shape of the IC.

Meanwhile, an elevating part 46, 48, 49 is provided in the insertion hole 42 of the guide block 40 or in a sidewall of the guide block 40, in order to elastically elevate the IC since the IC closely adheres correspondingly to each of the terminals T of the test board B.

In configuring the elevating part 46, 48, 49, in this example, a support flute 48 is formed to be parallel with the direction of the flute or protrusion provided as the guide part 44, in the insertion hole 42 of the guide block 40 or on an inner sidewall of the guide block 40. Herewith, the insertion hole 42 or the inner sidewall of the guide block 40 approximately corresponds to a side face of the inserted integrated circuit IC. Further, a support member 46 is adapted to be inserted into and be guided during elevation by the support flute 48. An end part of the support member 46 projects from a side part of the guide block 40 to support a corresponding surface, projection or flute formed on the IC. Also, a resilient member 49 can be configured on the support flute 48, to elastically elevate the support member 46.

A pressurizing plate 50 is included, having protrusions 54 at a bottom surface thereof that, once mounted, apply pressure to underlying leads L of the IC to urge the leads L against the terminals T of the test board B. An aligning part 56 can be formed between the pressurizing protrusions 54 to support an upper face or a circumference of the IC and to further guide the position of the IC, so as to increase accuracy of the corresponding individual connection between the leads L of the IC and the terminals. As shown in FIG. 3 or 5a and 5b, the aligning part 56 can be formed in a pin shape, and on an upper face edge portion of the IC body corresponding to the aligning part 56, an aligning flute 66 can be formed to correspond with the aligning part 56 or pins. In this configuration, an upper face edge portion or an edge girth of the IC can be formed to be stepped, or an upper face portion of the IC can be formed as a flute or protrusion having a determined shape and a bottom face of the pressurizing plate 50 can be formed as a shape conformable to the upper surface of the IC.

Though a direct connection between the IC and the test board B is described above, it can be configured that if it is assumed that the pressurizing plate 50 corresponding to the guide block 40 is defined as a first pressurizing plate; a conventional needle block 20 provided with a plurality of needles 22 as described above, and its corresponding pressurizing plate, namely a second pressurizing plate 30, can be installed in place of both the guide block 40 and the first pressurizing plate 50. In this manner, direct or indirect connection of the IC to the test board can be selectively performed.

In the meantime, in order to more efficiently utilize the socket assembly and in order to reduce load capacity through the direct connection of the IC, based on the drive toward higher integration, variations in the physical configuration of the IC may be required by manufacturing. To satisfy this requirement condition, and to obtain more definite aligning relationship for the terminals provided on the test board B using the guide part 44; as a portion for a standard of an aligning position, a side part of the IC body can be formed as a vertical flute or protrusion, and a corner portion of the IC body can be provided as an aligning face having a vertical chamfer, and a sidewall of the IC can be provided as a stepped face in the girth direction, etc. The guide part 44 is shaped to mate with the standardized alignment face on the IC and thus guide the insertion and removal sliding movement of the IC. Though in the configuration of the IC shown in FIGS. 3 through 5b, it was described that a side face of the IC not having the leads L included the protrusion as the guide member 62, the guide part 44 may be formed as a shape of guiding the respective leads L, in which the form can be changed without departing from the scope of the invention. Further, as was described above, a support flute 48 can alternatively be formed on a portion of the IC body, correspondingly to the support member 46 of the elevating part, and the aligning flute 66 or aligning protrusion (not shown) can be formed on an upper part of the IC body corresponding to the aligning part 56 formed in the pressurizing plate 50.

In addition, the elevating part 46, 48, 49 can be configured to be selectively movable in ascending and descending directions from a lower part of the center portion of the terminal region of the test board B onto which the IC closely adheres, by manipulation of a test operator. By this configuration of the elevating part 46, 48, 49, before the IC guided and positioned by the guide part 44 is pressurized by the pressurizing protrusion 54 of the pressurizing plate 50, the elevating part 46, 48, 49 supports the IC so that the respective leads L of the IC are approximate to and parallel with the test board B oppositely the respective terminals T provided on the test board B, which results in that the pressurizing plate 50 is then lowered to urge the connection between the IC and the test board B. This functions to prevent in advance the IC from being guided and positioned by an irregular force applied to the guide part 44.

During a testing operation of the IC, the main body 10 is assembled with the guide block 40 on the test board B, and an operator positions the IC within the guide block 40. At this time, the guide part 44 aligns with a side portion of the IC and guides vertical insertion of the IC, while maintaining its horizontal state. The elevating part 46, 48, 49 elastically provides the proper vertical position of the IC, thus the IC is properly positioned to be spaced apart by a certain distance from an upper side of the test board B.

Due to the above alignment procedure, the leads L of the IC are each individually opposite the terminals T, and the pressurizing plate 50 applies downward pressure to the leads by using the pressurizing protrusion 54, and is equipped to align with the main body 10 or the guide block 40, so that the leads L of the IC are individually pressurized from above to closely adhere to the opposite terminals T, thereby the leads L and the terminals T are connected with one another individually so as to undergo the test. Subsequently, when the test procedure is completed, the operator separates the pressurizing plate 50 from the main body 10 or the guide block 40, and at this time, the elevating part 46, 48, 49 re-elevates the IC above the test board B so that it can be easily removed by the operator.

In configuring a tester using a socket assembly for guiding direct connection of an integrated circuit to a test board according to an exemplary embodiment of the present invention, and as was described above, first the socket assembly includes the guide block 40, the guide part 44, and the pressurizing plate 50. The guide block 40 is installed in the region of the terminals provided on the test board B, to define an installation region for the IC. The guide part 44 is equipped with a vertical flute or protrusion formed on an inner side portion of the guide block 40, in order to guide insertion and removal of the IC to ensure that the leads L are in alignment with the terminals T. The pressurizing plate 50 applies pressure to the leads through the pressurizing protrusion 54 on its lower face, so as to individually connect the leads with the terminals through a combination with the guide block 40. In configuring the tester, the socket assembly having this configuration is provided with an elevating part, wherein the elevating part is equipped to be resiliently ascending and descending from a lower part of a center portion of the terminal region provided on the test board B, and is adapted to seat the bottom of the IC in close proximity to the test board B through manipulation by a worker. This elevating part supports the IC body so that the leads L of the IC are each positioned approximately to each corresponding terminal T, like the afore-described elevating part, and at the same time, functions as supporting the horizontal state of the IC.

In the above-described exemplary embodiments of the present invention, and in such a relationship that the pressurizing plate 50 is combined with the main body 10 or the guide block 40, to pressurize each lead L of the IC to be connected to each opposite terminal T; an elastic seat 72 can be provided on a lower surface of the pressurizing protrusions 54 of the pressurizing plate 50 so as to elastically pressurize the respective leads L by using the pressurizing protrusion 54.

As was described above, a guide block for directly connecting an integrated circuit to a test board, and a needle block for indirectly connecting the same, are assembled selectively, to thus increase a test efficiency by selecting the direct and indirect connection of the integrated circuit to the test board, and to enhance reliability in the electrical characteristic test of the integrated circuit by reducing load capacity between respective terminals provided on the test board and respective leads of the integrated circuit through the direct connection of the integrated circuit.

In addition, in various needle specifications based on the indirect connection and in the determination of load capacity of the needles based on data collected during the direct connection test, through the selection of the direct or indirect connection, an electrical characteristic test can be performed diversely and easily through comparison and checking, to thus readily determine a needle specification having a proper structure, and to shorten the time required for test, and to continuously perform the test of the direction connection for a large number of chips without unnecessarily damaging the test board.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A socket assembly for an integrated circuit test, comprising:
   a guide block provided in a terminal region of a test board, said guide block defining an area into which an integrated circuit can be inserted opposite terminals formed on an upper surface of the test board in the terminal region;
   a guide part provided on an inner side wall of the guide block, to guide an insertion position of the integrated circuit so that respective leads of the integrated circuit are aligned with the corresponding terminals of the test board; and
   a pressurizing plate adapted to interface with the guide block, the pressurizing plate including a pressurizing protrusion on a surface thereof, such that when the pressurizing plate is applied to the guide block, the respective leads of the integrated circuit are urged to directly connect with the corresponding terminals of the upper surface of the test board.

2. The assembly as claimed in claim 1, wherein the guide block is shaped to include an insertion hole, through which the terminal region of the test board is exposed and in which the integrated circuit can be inserted; and wherein the guide part is provided on an inner wall of the insertion hole, and is configured as a vertical flute or protrusion to mate with a mating protrusion or flute on a side portion of the integrated circuit so as to guide the horizontal position of the integrated circuit during vertical insertion.

3. The assembly as claimed in claim 1, wherein the guide block comprises at least two independent separated sidewalls positioned in the terminal region of the test board, and wherein the guide part is configured at the sidewall of the guide block as a vertical flute or protrusion to mate with a mating protrusion or flute on a side portion of the integrated circuit so as to guide the horizontal position of the integrated circuit during vertical insertion.

4. The assembly as claimed in claim 1, wherein the guide block further comprises an elevating part, said elevating part being adapted to support and elastically elevate an inserted integrated circuit.

5. The assembly as claimed in claim 4, wherein the elevating part further comprises:
   a vertical support flute, said support flute being formed on an inner wall of the guide block, wherein said elevating part comprises a support member inserted into the support flute to be vertically raised and lowered so that an end part of the support member projecting from the guide block supports an inserted integrated circuit; and
   a resilient member communicating with the support member, for elastically elevating the support member.

6. The assembly as claimed in claim 1, wherein the pressurizing plate further comprises an aligning part, said aligning part being formed between the pressurizing protrusion and being for mating with an alignment feature of the integrated circuit.

7. The assembly as claimed in claim 1, wherein the pressurizing plate further comprises an elastic member for elastically pressurizing the leads of the integrated circuit through the pressurizing protrusion.

8. A socket assembly for an integrated circuit test, comprising:
   a main body provided on a test board to expose a terminal region, an upper surface of the terminal region having terminals formed thereon;

a guide block provided in the main body defining an area into which an integrated circuit can be inserted opposite the terminals of the terminal region;

a guide part provided on an inner side wall of the guide block, to guide an insertion position of the integrated circuit so that respective leads of the integrated circuit are aligned with the corresponding terminals of the test board; and a first pressurizing plate adapted to interface with at least one of the main body and an upper part of the guide block, the first pressurizing plate including a pressurizing protrusion on a surface thereof, such that when the first pressurizing plate is applied to the at least one of the main body and the guide block, the integrated circuit abuts the test board and the respective leads of the integrated circuit are urged to directly connect with the corresponding terminals of the upper surface of the test board.

9. The assembly as claimed in claim 8, further comprising:

a needle block adapted to replace the guide block configured to cover the terminal region, said needle block supporting the integrated circuit and elastically connecting the respective leads of the integrated circuit and the corresponding terminals of the test board, the needle block including a plurality of needles, the upper and lower ends of which pierce upper and lower surfaces of the needle block to connect the integrated circuit leads and the terminals of the test board; and a second pressurizing plate adapted to replace the first pressurizing plate, the second pressurizing plate including a pressurizing protrusion on a surface thereof, such that when the second pressurizing plate is applied to the needle block, the respective leads of the integrated circuit are urged to connect with the underlying needle upper ends.

10. The assembly as claimed in claim 8, wherein the guide block further comprises an elevating part, said elevating part being adapted to support and elastically elevate an inserted integrated circuit.

11. The assembly as claimed in claim 8, wherein the guide block is shaped to include an insertion hole, through which the terminal region of the test board is exposed and in which the integrated circuit can be inserted; and wherein the guide part is provided on an inner wall of the insertion hole, and is configured as a vertical flute or protrusion to mate with a mating protrusion or flute on a side portion of the integrated circuit so as to guide the horizontal position of the integrated circuit during vertical insertion.

12. The assembly as claimed in claim 8, wherein the guide block comprises at least two independent separated sidewalls positioned in the terminal region of the test board, and wherein the guide part is configured at the sidewall of the guide block as a vertical flute or protrusion to mate with a mating protrusion or flute on a side portion of the integrated circuit so as to guide the horizontal position of the integrated circuit during vertical insertion.

13. An integrated circuit, in a socket assembly, which includes a guide block provided in a terminal region of a test board, the guide block defining an area into which an integrated circuit body having a plurality of leads can be inserted; a guide part provided on an inner side wall of the guide block having a vertical flute or protrusion, to guide an insertion position of the integrated circuit body so that the respective leads are each aligned with corresponding terminals of the test board; and a pressurizing plate including a pressurizing protrusion on a surface thereof, such that when pressurizing force is applied to the guide block, the respective leads of the integrated circuit are urged to connect with the corresponding terminals of the test board, said integrated circuit comprising:

a guide member in the shape of a vertical protrusion or flute adapted to mate with the vertical flute or protrusion of the inner side wall of the guide block, for aligning the integrated circuit relative to the guide block.

14. The circuit as claimed in claim 13, wherein the socket assembly further comprises an elevating part on the guide block, said elevating part including a vertical support flute; a support member inserted into the support flute to be vertically raised and lowered so that an end part of the support member projecting from the guide block supports an inserted integrated circuit; and a resilient member communicating with the support member, for elastically elevating the support member; and further comprising a support flute formed on a surface of the integrated circuit to be supported by the end part of the support member.

15. The circuit as claimed in claim 14, wherein the pressurizing plate further comprises an aligning part, said aligning part being formed between the pressurizing protrusion and being for mating with an alignment feature of the integrated circuit.

16. An integrated circuit tester, in a socket assembly, which includes a guide block provided in a terminal region of a test board, the guide block defining an area into which an integrated circuit body having a plurality of leads can be inserted; a guide part provided on an inner side wall of the guide block having a vertical flute or protrusion, to guide an insertion position of the integrated circuit body so that the respective leads are each aligned with corresponding terminals of the test board; and a pressurizing plate including a pressurizing protrusion on a surface thereof, such that when pressurizing force is applied to the guide block, the respective leads of the integrated circuit are urged to connect with the corresponding terminals of the test board, said integrated circuit tester comprising:

a guide member in the shape of a vertical protrusion or flute adapted to mate with the vertical flute or protrusion of the guide block, for aligning the integrated circuit relative to the guide block.

17. A socket assembly for an integrated circuit test, comprising:

a guide block provided in a terminal region of a test board, said guide block defining an area into which an integrated circuit can be inserted opposite terminals formed on the test board in the terminal region;

a guide part provided on an inner side wall of the guide block, to guide an insertion position of the integrated circuit so that respective leads of the integrated circuit are aligned with the corresponding terminals of the test board; and a pressurizing plate adapted to interface with the guide block, the pressurizing plate including a pressurizing protrusion on a surface thereof, such that when the pressurizing plate is applied to the guide block, the respective leads of the integrated circuit are urged to connect with the corresponding terminals of the test board, wherein the pressurizing plate further comprises an aligning part, said aligning part being formed between the pressurizing protrusion and being for mating with an alignment feature of the integrated circuit.

18. A socket assembly for an integrated circuit test, comprising:

a guide block provided in a terminal region of a test board, said guide block defining an area into which an integrated circuit can be inserted opposite terminals formed on the test board in the terminal region;

a guide part provided on an inner side wall of the guide block, to guide an insertion position of the integrated circuit so that respective leads of the integrated circuit are aligned with the corresponding terminals of the test board; and a pressurizing plate adapted to interface with the guide block, the pressurizing plate including a pressurizing protrusion on a surface thereof, such that when the pressurizing plate is applied to the guide block, the respective leads of the integrated circuit are urged to connect with the corresponding terminals of the test board, wherein the pressurizing plate further comprises an elastic member for elastically pressurizing the leads of the integrated circuit through the pressurizing protrusion.

19. A socket assembly for an integrated circuit test, comprising:

a main body provided on a test board to expose a terminal region, the terminal region having terminals formed thereon;

a guide block provided in the main body defining an area into which an integrated circuit can be inserted opposite the terminals of the terminal region;

a guide part provided on an inner side wall of the guide block, to guide an insertion position of the integrated circuit so that respective leads of the integrated circuit are aligned with the corresponding terminals of the test board;

a first pressurizing plate adapted to interface with at least one of the main body and an upper part of the guide block, the first pressurizing plate including a pressurizing protrusion on a surface thereof, such that when the pressurizing plate is applied to the at least one of the main body and the guide block, the respective leads of the integrated circuit are urged to connect with the corresponding terminals of the test board;

a needle block adapted to replace the guide block configured to cover the terminal region, said needle block supporting the integrated circuit and elastically connecting the respective leads of the integrated circuit and the corresponding terminals of the test board, the needle block including a plurality of needles, the upper and lower ends of which pierce upper and lower surfaces of the needle block to connect the integrated circuit leads and the terminals of the test board; and a second pressurizing plate adapted to replace the first pressurizing plate, the second pressurizing plate including a pressurizing protrusion on a surface thereof, such that when the second pressurizing plate is applied to the needle block, the respective leads of the integrated circuit are urged to connect with the underlying needle upper ends.

20. An integrated circuit, in a socket assembly, which includes a guide block provided in a terminal region of a test board, the guide block defining an area into which an integrated circuit body having a plurality of leads can be inserted; a guide part provided on an inner side wall of the guide block having a vertical flute or protrusion, to guide an insertion position of the integrated circuit body so that the respective leads are each aligned with corresponding terminals of the test board; and a pressurizing plate including a pressurizing protrusion on a surface thereof, such that when pressurizing force is applied to the guide block, the respective leads of the integrated circuit are urged to connect with the corresponding terminals of the test board, wherein the socket assembly further comprises an elevating part on the guide block, said elevating part including a vertical support flute; a support member inserted into the support flute to be vertically raised and lowered so that an end part of the support member projecting from the guide block supports an inserted integrated circuit; and a resilient member communicating with the support member, for elastically elevating the support member; and further comprising a support flute formed on a surface of the integrated circuit to be supported by the end part of the support member, said integrated circuit comprising:

a guide member in the shape of a vertical protrusion or flute adapted to mate with the vertical flute or protrusion of the guide block, for aligning the integrated circuit relative to the guide block.

21. The circuit as claimed in claim 20, wherein the pressurizing plate further comprises an aligning part, said aligning part being formed between the pressurizing protrusion and being for mating with an alignment feature of the integrated circuit.

* * * * *